United States Patent [19]

Sugiyama

[11] Patent Number: 4,615,614

[45] Date of Patent: Oct. 7, 1986

[54] OPTICAL EXPOSURE APPARATUS

[75] Inventor: Shuji Sugiyama, Katsuta, Japan

[73] Assignee: Hitachi, Ltd., Tokyo, Japan

[21] Appl. No.: 671,218

[22] PCT Filed: Mar. 16, 1984

[86] PCT No.: PCT/JP84/00107

§ 371 Date: Nov. 14, 1984

§ 102(e) Date: Nov. 14, 1984

[30] Foreign Application Priority Data

Mar. 16, 1983 [JP] Japan ................................ 58-42254

[51] Int. Cl.[4] .............................................. G03B 27/42
[52] U.S. Cl. ......................................... 355/53; 355/55
[58] Field of Search ....................... 355/40, 53, 54, 55

[56] References Cited

U.S. PATENT DOCUMENTS 4,084,903 4/1978 Pircher .................................. 355/53
4,155,642 5/1979 Lacombat ............................ 355/53

FOREIGN PATENT DOCUMENTS 52-143775 11/1977 Japan .
53-65068 6/1978 Japan .

Primary Examiner—L. T. Hix
Assistant Examiner—Brian W. Brown
Attorney, Agent, or Firm—Antonelli, Terry & Wands

[57] ABSTRACT

An optical exposure apparatus which is suitable for the production of semiconductor devices. To minimize the regions which are not used for exposure around the periphery of a surface being exposed, such as the surface of a semiconductor wafer, a plurality of independent focusing detectors utilizing a gas are arranged about the optical axis of light.

8 Claims, 4 Drawing Figures

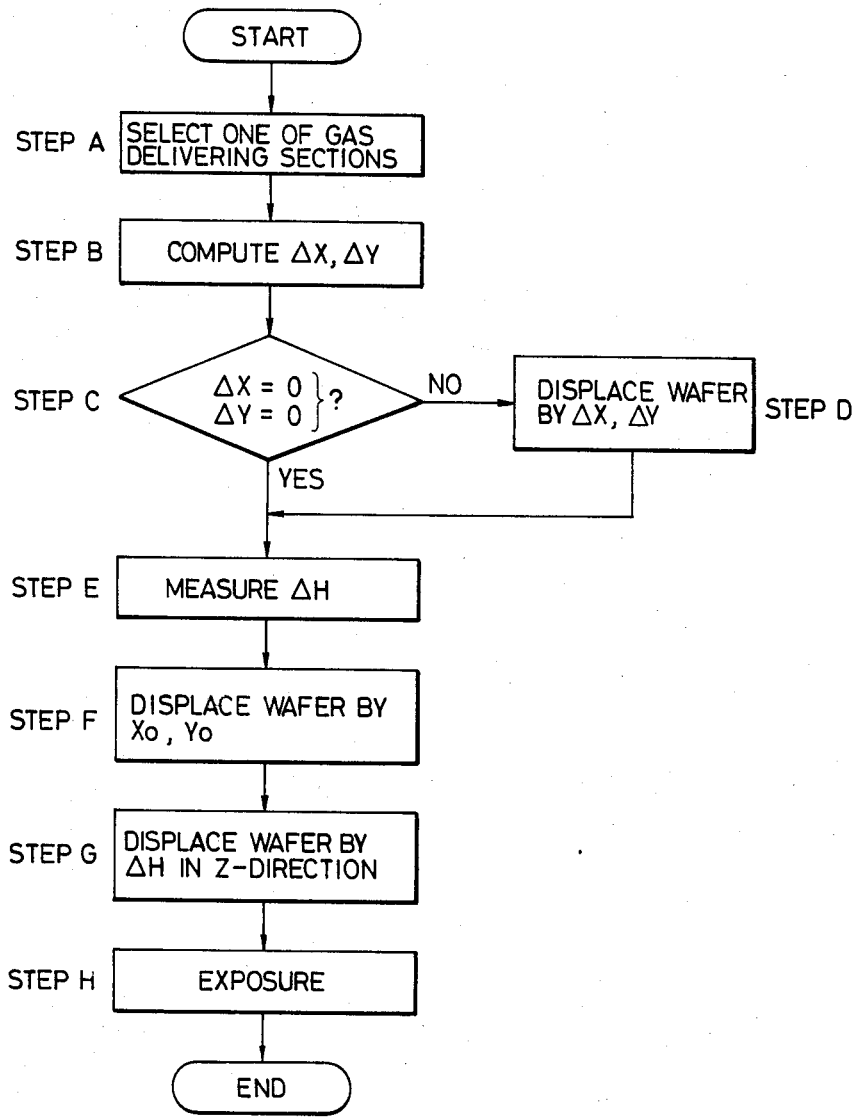

OPTICAL EXPOSURE APPARATUS

BACKGROUND OF THE INVENTION

The present invention relates to an optical exposure apparatus, and, more particularly, to an optical exposure apparatus which is suitable for optically forming a predetermined pattern on an exposed surface such as a semiconductor wafer.

An optical exposure apparatus includes a means for irradiating a pattern with light, means for directing light obtained from the pattern onto surface being exposed so that an image of the pattern is formed on the surface, and means for moving the surface being exposed so that the exposure position on the surface is changed.

To precisely form an image of the pattern on the surface being exposed, it is necessary to effect focusing so that the image of the pattern is correctly formed on the surface being exposed. An apparatus for effecting forcusing includes means for detecting any deviation from a predetermined reference in the distance between the surface being exposed and the means for directing light, and means for moving the surface to compensate for that deviation. The means for detecting the deviation often has gas-delivering hole through which a gas is emitted toward to the surface being exposed, and means for detecting any change in the gas flow rate through the gas-delivering hole due to the deviation.

However, an axis of the gas-delivering hole is usually aligned with the optical axis of the light directed onto the surface being exposed. Therefore, the gas-delivering hole must be large enough so that it does not hinder the light travelling along the optical axis. Therefore, an increased exposure surface is inevitably required so that any change in the gas flow rate through the gas-delivering hole due to deviation in the distance between the surface being exposed and the light-directing means, from a predetermined reference can be detected. This means that wide, useless regions which are not exposed must be provided around the periphery of the surface being exposed.

One object of the present invention is to provide an optical exposure apparatus which is suitable for preventing the formation of a wide, useless region which will not be exposed, around the peripheral edge of the surface being exposed.

Another object of the present invention is to provide an optical exposure apparatus which is suitable for obtaining a high production rate.

According to the present invention, a pattern is irradiated with light, and light obtained from the pattern is then directed onto the surface being exposed, so that an image of the pattern is formed on the surface. The surface is moved so that the exposure position can be changed.

Provision is made of means for detecting any deviation from a predetermined reference in the distance between the surface being exposed and the light-directing means, and means which moves the surface being exposed so as to compensate for such deviation. The detection means includes means in which a plurality of gas-delivering holes are provided around the optical axis of the light directed onto the surface being exposed, the gas being emitted toward different positions on the surface being exposed, and means for detecting any change in the gas flow rate through the plurality of gas-delivering holes due to a deviation from the predetermined reference in the distances between different positions on the surface being exposed and the light-directing means.

BRIEF DESCRIPTION OF DRAWINGS

FIG. 4 is a flow chart of the procedure for the exposure.

DETAILED DESCRIPTION

Figure 1:
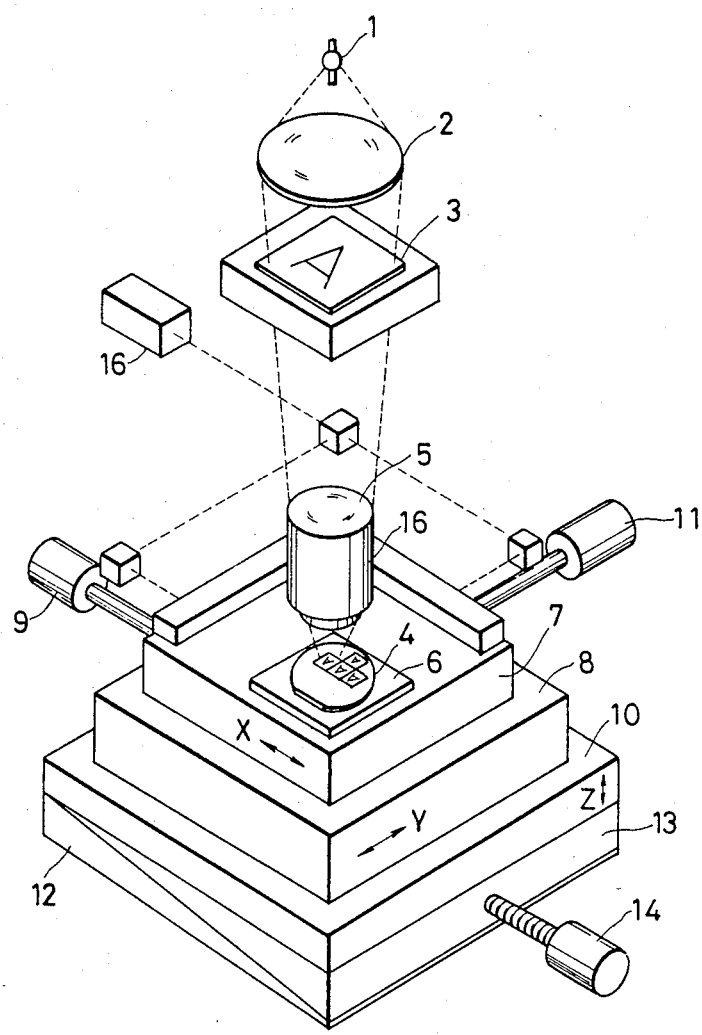
FIG. 1 is a schematic perspective view of an optical exposure apparatus according to an embodiment of the present invention.

Referring now to the drawings wherein like reference numerals are used throughout the various views to designate like parts and, more particularly, to FIG. 1, according to this figure, light emitted from a light source 1, such as a mercury lamp, is focused by a condenser lens 2, and falls on a pattern formed on a transparent plate 3, called a reticle or mask. Light which has passed through the transparent plate 3 is directed through a projection lens 5 onto a semiconductor wafer 4, so that the pattern is formed at a reduced scale or at the same scale on the surface of the semiconductor wafer 4 which is being exposed. The semiconductor wafer 4 is held by a wafer holder 6 which is supported by a movable bed 7, which is supported by another movable bed 8. The movable bed 7 can be displaced along the movable bed 8 in the X-axis direction by a drive device 9. The movable bed 8 is supported by a movable bed 10, and can be displaced along the movable bed 10 by a drive device 11 in the Y-axis direction, perpendicular to the X-axis. A movable bed 13 is interposed between the movable bed 10 and a fixed bed 12. When the movable bed 13 is displaced in the X-axis direction by a drive device 14, the movable bed 10 is moved in the Z-axis direction, perpendicular to both the X-axis and Y-axis, i.e., moves along the optical axis of the light directed onto the semiconductor wafer 4.

The displacement of the movable bed 7 in the X-axis direction by the drive device 9 and the displacement of the movable bed 8 in the Y-axis direction by the drive device 11, i.e., the two-dimensional displacement of the semiconductor wafer 4 in the X-axis and Y-axis directions, is effected in steps by a computer 15 (FIG. 2) which controls the drive devices 9, 11. A position-measuring device 16, which utilizes a laser beam, measures the exposure position on the semiconductor wafer 4, i.e., measures the position of the exposed region displaced from the position of optical axis in the X-axis and Y-axis directions. The computer 15 determines whether the measured position agrees with a position set by the computer 15, and, if there is any difference between the set position and the measured position, the computer 15 controls the drive devices 9 and 11 so as to compensate for that difference.

Figure 2:
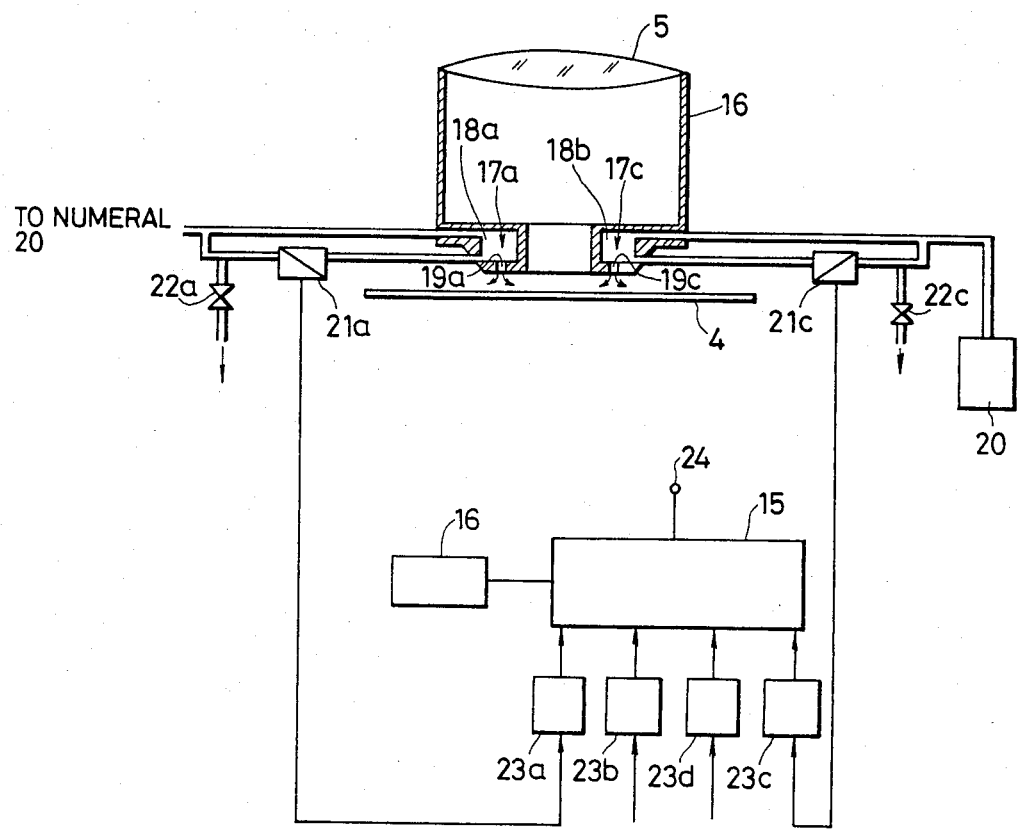
FIG. 2 is a schematic diagram of a focusing means.

With reference to FIG. 2, a projection lens 5 is held by a lens holder 16 which has a light-transmitting hole at the lower end thereof, the axis of the light-transmitting hole being aligned along the optical axis. The lower end of the holder 16 is also provided with four independent gas-delivering sections 17a to 17d which are arranged around the optical axis. As can be seen from FIG. 3, the gas-delivering sections 17a and 17c are aligned along the X-axis, and the gas-delivering sections 17b and 17d along the Y-axis.

The gas-delivering sections 17a to 17d are provided with gas-introducing chambers 18a to 18d and gas-delivering holes 19a to 19d that communicate therewith. A gas, such as air or nitrogen, at a constant pressure, is emitted from a gas source 20 onto the surface of the semiconductor wafer 4 from the gas-delivering holes 19a to 19d, via the gas-introducing chambers 18a to 18d. Differential pressure converters 21a to 21d (21b and 21d are not shown) and needle valves 22a to 22d (22b and 22d are not shown) are provided to correspond to the four gas-delivering sections 17a to 17d. The differential pressure converters 21a to 21d generate electrical signals corresponding to differential pressure, i.e., corresponding to the difference between a predetermined reference pressure obtained when gas is emitted from the gas-introducing source 20 to the atmosphere through the needle valves 22a to 22d and a back pressure produced when the gas is emitted onto the surface of the semiconductor wafer 4 through the gas-delivering holes 19a to 19d which face the semiconductor wafer 4. The electrical signals are inputted to the computer 15 through gain-adjusting circuits 23a to 23d which correct characteristics inherent to the differential pressure converters 21a to 21d. The computer 15 selects one of the outputs of the gain-adjusting circuits 23a to 23d and sends it to a terminal 24. The electrical signal output from the terminal 24 is fed back to the drive device 14 so that the movable bed 10 is displaced in the Z-axis direction accordingly.

For example, if the distance between the projection lens 5 and a portion on the surface of the semiconductor wafer 4 opposite the gas-delivering hole 19a deviates from a predetermined reference value, the flow rate of gas emitted from the gas-delivering hole 19 changes according to the deviation. The change in flow rate is detected by the differential pressure converter 21a as a change in back pressure. The differential pressure converter 21a outputs an electrical signal corresponding to the change in back pressure, and this electrical signal is an output from the terminal 24 of the computer 15 through the gain-adjusting circuit 23a. This electrical signal output from the terminal is fed back to the drive device 14 to displace the semiconductor wafer 4 in the Z-axis direction to compensate for the change in back pressure, i.e., to compensate for the deviation.

The procedure of focusing and exposure will be described below in conjunction with FIG. 4. To aid comprehension, the coordinate position of the optical axis of the light directed onto the semiconductor wafer 4, i.e., the exposure position, is assumed to be at the origin (O, O) in the cartesian coordinate system. It is also assumed that the computer 15 controls the drive devices 9, 10 so that the semiconductor wafer 4 is successively displaced sttep-by-step in a predetermined direction. The region exposed after the region at the current exposure position on the semiconductor wafer 4 is given by $(x_1, y_1)$, i.e., the coordinates of the region exposed next are $(x_1, y_1)$.

Figure 3:
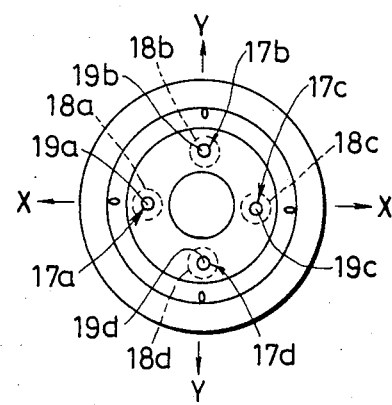
FIG. 3 is a bottom view of the lens holder of FIG. 2.

In step A of FIG. 4, the computer 15 determines which of the gas-delivering sections 17a to 17d should be used to measure or detect to what extent the surface of the region at coordinates $(x_1, y_1)$, which is to be exposed next, deviates from the predetermined reference position along the optical axis. For this purpose, the displacement of the semiconductor wafer 4 should be minimized in subsequent steps D and F to increase the throughput. With reference to FIG. 3, the gas-delivering section 17b should be used when $y_1 \geq x_1$ and $y_1 \geq -x_1$, the gas-delivering section 17c should be used when $y_1 > x_1$ and $y_1 > -x_1$, the gas-delivering section 17d should be used when $y_1 \leq x_1$ and $y_1 \leq -x_1$, and the gas-delivering section 17a should be used when $y_1 > x_1$ and $y_1 < -x_1$. In this case, the selection of a gas-delivering section 17a to 17d is simply a selection of the corresponding gain-control circuit 23a to 23d.

In step B, if the (fixed) coordinates of the selected gas-delivering section are assumed to be $(x_0, y_0)$, the computer 15 computes the deviation between the selected coordinates $(x_0, Y_0)$ and the position $(x_1, y_1)$ which will be exposed next, i.e., calculates $\Delta x = x_1 - x_0$, $\Delta y = y_1 - y_0$, and in step C, the computer determines whether or not $\Delta x$, $\Delta y$, are zero.

In step D, if one or both of $\Delta x$ and $\Delta y$ is found to be not zero in step C, the computer 15 controls the drive device 9 and/or the drive device 11 to displace the semiconductor wafer 4 until the position $(x_1, y_1)$ of the next exposure is at the coordinates $(x_0, y_0)$ of the selected gas-delivering section.

In step E, if it is determined in step C that $\Delta x = 0$, $\Delta y = 0$, or if $\Delta x = 0$ and $\Delta y = 0$ are achieved in step D by moving the semiconductor wafer 4, the deviation $\Delta H$ in the direction of the optical axis from the predetermined position in the region being exposed next is measured by the gas-delivering section at the coordinates $(x_0, y_0)$, a differential pressure detector corresponding thereto and a gain control circuit connected thereto, and the deviation $\Delta H$ is input to the computer 15.

In step F, the computer 15 controls the drive devices 9, 11 to displace the semiconductor wafers 4 by $x_0, y_0$, so that the next exposure position at coordinates $(x_0, y_0)$ agrees with the origin (0, 0).

In step G, the computer 15 controls the drive device 14 to displace the region which has been moved to the origin, and which will be exposed next, by $\Delta H$ in the Z-axis direction, to complete the focusing of the region which will be exposed next, and in step H the region for which focusing has been completed, is then exposed.

The region which was at the origin at first can be exposed continuously up to step E (or up to step C when step D is required).

The advantages provided by the embodiment described above are summarized below.

The axes of the gas-delivering holes are not aligned with the optical axis, but are arranged around the optical axis. Therefore, the size of the gas-delivering holes can be reduced as desired, without restricting the light passing along the optical axis. This means that the area of the region being exposed which is necessary for the focusing can be reduced. In other words, it is possible to reduce the area of useless regions which are not exposed, but which must be provided around the periphery of the surface being exposed.

A plurality of both gas-delivering holes which are not aligned along the optical axis and means for detecting changes in the gas flow rate through these holes are provided, so that they can be selectively used to minimize the displacement of the semiconductor wafer in the X-axis and Y-axis directions during focusing. This means that this embodiment is suitable for obtaining a high production rate.

In this embodiment, the computer 15 can average the output signals of the gain control circuits 23a to 23d, and control the drive device 14 to effect focusing by utilizing the average value. The basic idea is that the deviation from the predetermined position along the optical axis of the exposed region of the semiconductor wafer aligned with the optical axis is regarded to be equal to the average deviation from the predetermined position along the optical axis of the surface portions of the semiconductor wafer corresponding to the gas-delivering holes 19a to 19d which are arranged around the optical axis.

When part of the periphery of the semiconductor wafer is being exposed, one or more of the gas-delivering holes 17a to 17d are outside the semiconductor wafer and are not used for focusing. In this case, the electrical signals related to the gas-delivering holes which are outside the wafer are excluded from the signals used for averaging. An extremely large difference can occur in the intensity of an electrical signal, depending upon whether the corresponding gas-delivering hole is outside the semiconductor wafer or is within the semiconductor wafer, so whether or not each gas-delivering hole is outside the semiconductor wafer is determined by the computer 15, relying upon whether or not the electrical signal related to each individual gas delivering hole is greater than a predetermined level. The computer 15 averages only those electrical signals which are greater than the predetermined level, and are thus obtained from gas-delivering hole which are not outside the semiconductor wafer. The computer 15 performs sixteen different judgements, as shown in Table 1, so as to average only those electrical signals which are greater than the predetermined level. In Table 1, L denotes that the output of one of the gain control circuits 23a to 23d is larger than the predetermined level, and S that it is smaller than the predetermined level.

TABLE 1

| | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| 23a | L | L | L | L | L | L | L | L | S | S | S | S | S | S | S | S |
| 23b | L | L | L | L | S | S | S | S | L | L | L | L | S | S | S | S |
| 23c | L | L | S | S | L | L | S | S | L | L | S | S | L | L | S | S |
| 23d | L | S | L | S | L | S | L | S | L | S | L | S | L | S | L | S |

What is claimed is:

1. An optical exposure apparatus comprising:
means for arranging an exposure surface on a plane, the exposure surface being provided with a plurality of regions to be exposed,
means for displacing the exposure surface so as to selectively arrange one of a plurality of regions to be exposed at a predetermined position on the plane,
means for irradiating a pattern with light,
means for projecting light obtained from the pattern onto the predetermined position so as to form an image of the pattern on one of the plurality of regions to be exposed which has been arranged at the predetermined position,
a plurality of gas delivering holes arranged around the optical axis of the light projected onto the predetermined position so as to deliver a gas toward different positions on the exposure surface through the plurality of gas delivering holes,
a plurality of detectors corresponding to the plurality of gas delivering holes, with each of the detectors detecting a change in flow rate of the gas delivered through the corresponding gas delivering hole based on a change in position of the exposure surface in a direction of the optical axis of the light projected onto the predetermined position,
means for selecting one of the plurality of gas delivering holes according to the position of one of the plurality of regions to be exposed which is to be arranged next at the predetermined position, whereby the detected change in flow rate corresponding to the selected gas delivering hole is selectively determined,
means for driving the exposure surface displacing means so as to subject the region to be exposed which is to be arranged next at the predetermined position to the gas delivered through the selected gas delivering hole, and
means for displacing the exposure surface in the direction of the optical axis on the basis of the selectively determined detected change in flow rate so as to compensate for the change in position of the exposure surface.

2. An optical exposure apparatus according to claim 1, wherein a selected one of the gas delivering holes is nearest to a region to be exposed which is to be arranged next at the predetermined position.

3. An optical exposure apparatus according to claim 1, wherein at least two delivering holes and at least two detectors are provided.

4. An optical exposure apparatus according to claim 1, wherein at least two delivering holes and at least two detectors are provided, and the selected gas delivering hole is nearer than the other of the two gas delivering holes to a region to be exposed which is to be arranged next at the predetermined position.

5. An optical exposure apparatus comprising:
means for arranging an exposure surface on a plane, the exposure surface being provided with a plurality of regions to be exposed,
means for displacing the exposure surface so as to selectively arrange one of the plurality of regions to be exposed at a predetermined position on the plane,
means for emitting a light beam,
means for irradiating a pattern with the light beam to transmit the same through the pattern,
means for projecting the transmitted light beam onto the predetermined position so as to form an image of the pattern on the one of the plurality of regions to be exposed which has been arranged at a predetermined position,
a plurality of gas delivering holes arranged around the optical axis of the transmitted light beam projected onto the predetermined position so as to deliver a gas toward different positions on the exposure surface through the plurality of gas delivering holes,
a plurality of detectors corresponding to the plurality of gas delivering holes, with each of the detectors being adapted to detect a change in flow rate of the gas delivered through the corresponding gas delivering hole based on a change in position of the exposure surface in a direction of the optical axis of the transmitted light beam projected onto the predetermined position,
means for selecting one of the plurality of gas delivering holes according to the position of one of the plurality of regions to be exposed which is to be arranged next at the predetermined position, whereby the detected change in flow rate corresponding to the selected gas delivering hole is selectively determined,
means for driving the exposure surface displacing means so as to subject a region to be exposed which is to be arranged next at the predetermined position to the gas delivered through the selected gas delivering hole, and means for displacing the exposure surface in the direction of the optical axis on the basis of a selectively determined detected change in flow rate so as to compensate for a change in position of the exposure surface.

6. An optical exposure apparatus according to claim 5, wherein the selected one of the gas delivering holes is nearest to the region to be exposed which is arranged next at the predetermined position.

7. An optical exposure apparatus according to claim 5, wherein at least two gas delivering holes are provided, the two gas delivering holes are arranged at positions opposite to each other with respect to the optical axis of the transmitted light beam projected onto the predetermined position, and wherein at least two detectors are provided.

8. An optical exposure apparatus according to claim 5, wherein at least two gas delivering holes are provided, the two gas delivering holes are arranged at opposite positions to each other with respect to the optical axis of the transmitted light beam projected onto the predetermined position, at least two detectors are provided, and wherein the selected gas delivering hole is closer than the other of the two gas delivering holes to the region to be exposed which is to be arranged next at the predetermined position.

* * * * *